United States Patent
Jeon

(10) Patent No.: US 12,166,007 B2
(45) Date of Patent: Dec. 10, 2024

(54) SEMICONDUCTOR PACKAGE

(71) Applicant: Samsung Electronics Co., Ltd., Suwon-si (KR)

(72) Inventor: Byeonguk Jeon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 374 days.

(21) Appl. No.: 17/681,096

(22) Filed: Feb. 25, 2022

(65) Prior Publication Data

US 2022/0406746 A1    Dec. 22, 2022

(30) Foreign Application Priority Data

Jun. 21, 2021 (KR) .................. 10-2021-0079834

(51) Int. Cl.
*H01L 23/00* (2006.01)
*H01L 25/065* (2023.01)
(52) U.S. Cl.
CPC .......... *H01L 24/49* (2013.01); *H01L 24/09* (2013.01); *H01L 24/48* (2013.01); *H01L 25/0657* (2013.01); *H01L 24/32* (2013.01); *H01L 24/33* (2013.01); *H01L 24/73* (2013.01); *H01L 2224/09515* (2013.01); *H01L 2224/32145* (2013.01); *H01L 2224/33181* (2013.01); *H01L 2224/48145* (2013.01); *H01L 2224/48227* (2013.01); *H01L 2224/49109* (2013.01); *H01L 2224/49112* (2013.01); *H01L 2224/49175* (2013.01); *H01L 2224/73215* (2013.01); *H01L 2224/73265* (2013.01); *H01L 2225/06506* (2013.01); *H01L 2225/0651* (2013.01); *H01L 2225/06562* (2013.01); *H01L 2924/37001* (2013.01)

(58) Field of Classification Search
CPC ........................... H01L 2225/06562
See application file for complete search history.

(56) References Cited

U.S. PATENT DOCUMENTS

| | | | |
|---|---|---|---|
| 8,004,071 B2 | 8/2011 | Okumura et al. | |
| 9,947,644 B2 | 4/2018 | Hong et al. | |
| 10,002,853 B2 | 6/2018 | Oh | |
| 10,249,592 B2 | 4/2019 | Mostovoy et al. | |

(Continued)

FOREIGN PATENT DOCUMENTS

KR    20030048250 A    6/2003

*Primary Examiner* — Yu-Hsi D Sun
(74) *Attorney, Agent, or Firm* — Myers Bigel, P.A.

(57) ABSTRACT

A semiconductor package includes: a base substrate; a semiconductor chip stack including a plurality of semiconductor chips stacked on the base substrate in a first direction and each having an upper surface on which a plurality of pads are disposed; and bonding wire structures electrically connecting the base substrate and the semiconductor chips. The semiconductor chip stack includes a lower semiconductor chip stack and an upper semiconductor chip stack on the lower semiconductor chip stack. The plurality of semiconductor chips include a first semiconductor chip at an uppermost portion of the lower semiconductor chip stack and second semiconductor chips. The plurality of pads include first pads, aligned in a second direction, and second pads, spaced apart from the first pads in a third direction. The first pad on the first semiconductor chip, has an area larger than an area of each of the first pads on the second semiconductor chips.

20 Claims, 8 Drawing Sheets

(56) References Cited

U.S. PATENT DOCUMENTS

| | | |
|---|---|---|
| 10,651,146 B2 | 5/2020 | Lin |
| 2010/0265751 A1* | 10/2010 | Hong ........................ G11C 5/06 |
| | | 257/E23.141 |
| 2018/0005994 A1* | 1/2018 | Oh ........................... H01L 25/50 |
| 2018/0366441 A1 | 12/2018 | Lai et al. |

* cited by examiner

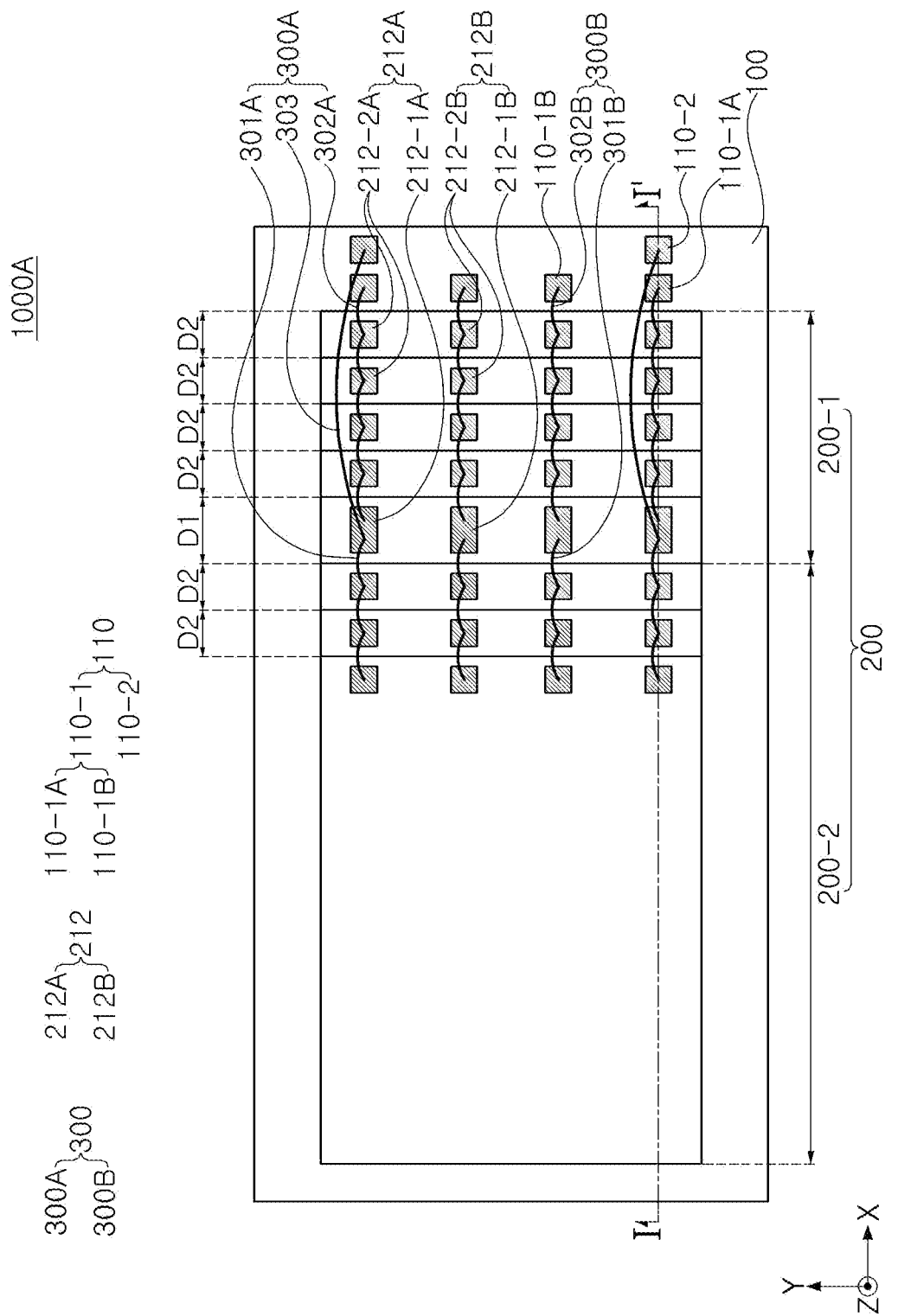

SEMICONDUCTOR PACKAGE

CROSS-REFERENCE TO RELATED APPLICATION(S)

This application claims benefit of priority to Korean Patent Application No. 10-2021-0079834, filed on Jun. 21, 2021 in the Korean Intellectual Property Office, the disclosure of which is incorporated herein by reference in its entirety.

BACKGROUND

The present inventive concept relates to a semiconductor package.

With the trend for weight reduction and high performance of electronic devices, miniaturization and high performance are also required in the semiconductor packaging field. Research and development into a semiconductor package, having a structure in which semiconductor chips are stacked in multiple stages, are continuously conducted to implement miniaturization, weight reduction, high performance, high capacity, and high reliability of a semiconductor package.

SUMMARY

Example embodiments provide a semiconductor package having improved reliability and yield.

According to an example embodiment, a semiconductor package includes: a base substrate; a semiconductor chip stack including a plurality of semiconductor chips stacked on the base substrate in a first direction, perpendicular to an upper surface of the base substrate and each having an upper surface on which a plurality of pads are disposed; and bonding wire structures electrically connecting the base substrate and the semiconductor chips. The semiconductor chip stack includes a lower semiconductor chip stack and an upper semiconductor chip stack on the lower semiconductor chip stack. The plurality of semiconductor chips include a first semiconductor chip at an uppermost portion of the lower semiconductor chip stack, and second semiconductor chips being the remaining semiconductor chips among the plurality of semiconductor chips. The plurality of pads include first pads, aligned in a second direction, and second pads, spaced apart from the first pads in a third direction, perpendicular to the first direction and the second direction. The first pad, disposed on the first semiconductor chip, has a planar area larger than a planar area of each of the first pads disposed on the second semiconductor chips.

According to an example embodiment, a semiconductor package includes: a base substrate; a first semiconductor chip stack including a plurality of semiconductor chips stacked on the base substrate in a first direction, perpendicular to an upper surface of the base substrate, with the plurality of semiconductor chips offset with respect to one another in a second direction, perpendicular to the first direction; and bonding wire structures electrically connecting the base substrate and the plurality of semiconductor chips. The first semiconductor chip stack includes a lower semiconductor chip stack and an upper semiconductor chip stack on the lower semiconductor chip stack. The plurality of semiconductor chips include a first semiconductor chip at an uppermost portion of the lower semiconductor chip stack, and second semiconductor chips being the remaining semiconductor chips among the plurality of semiconductor chips. The plurality of semiconductor chips includes a plurality of pads disposed on exposed upper surfaces of the plurality of semiconductor chips. The plurality of pads include first pads, aligned in a third direction, and second pads, spaced apart from the first pads in a fourth direction, perpendicular to the first direction and the third direction. The first pad, disposed on the first semiconductor chip, has a planar area larger than a planar area of each of the first pads disposed on the second semiconductor chips. The bonding wire structures include a first bonding wire structure and a second bonding wire structure. The first bonding wire structure includes a plurality of bonding wires electrically connecting the first pads and the base substrate to each other. The second bonding wire structure includes a plurality of bonding wires electrically connecting the second pads and the base substrate to each other. The total number of the bonding wires of the first bonding wire structure is greater than the total number of the bonding wires of the second bonding wire structure.

According to an example embodiment, a semiconductor package includes: a base substrate; a plurality of semiconductor chips stacked on the base substrate in a first direction, perpendicular to an upper surface of the base substrate, with the plurality of semiconductor chips offset in a second direction, perpendicular to the first direction, with respect to one another and each having an upper surface on which a first pad is disposed; and a first bonding wire structure electrically connecting the base substrate and the plurality of semiconductor chips. The plurality of semiconductor chips include a first semiconductor chip, a second semiconductor chip, and a third semiconductor chip that are sequentially stacked. The second semiconductor chip and the third semiconductor chip are offset with respect to each other in the second direction by a first distance that is greater than a second distance by which the first semiconductor chip and the second semiconductor chip are offset with respect to each other in the second direction. The first pad of the second semiconductor chip has an area larger than an area of the first pad of each of the first semiconductor chip and the third semiconductor chip. The first bonding wire structure includes a first bonding wire electrically connecting the first pad of the second semiconductor chip and the first pad of the third semiconductor chip, a second bonding wire electrically connecting the first pad of the first semiconductor chip and the first pad of the second semiconductor chip, and a third bonding wire electrically connecting the first pad of the second semiconductor chip and the base substrate.

BRIEF DESCRIPTION OF DRAWINGS

The above and other aspects, features, and advantages of the present inventive concept will be more clearly understood from the following detailed description, taken in conjunction with the accompanying drawings.

FIGS. 1A and 1B are a plan view and a cross-sectional view, respectively, of a semiconductor package according to an example embodiment.

DETAILED DESCRIPTION

Hereinafter, example embodiments will be described with reference to the accompanying drawings.

Figure 1B:
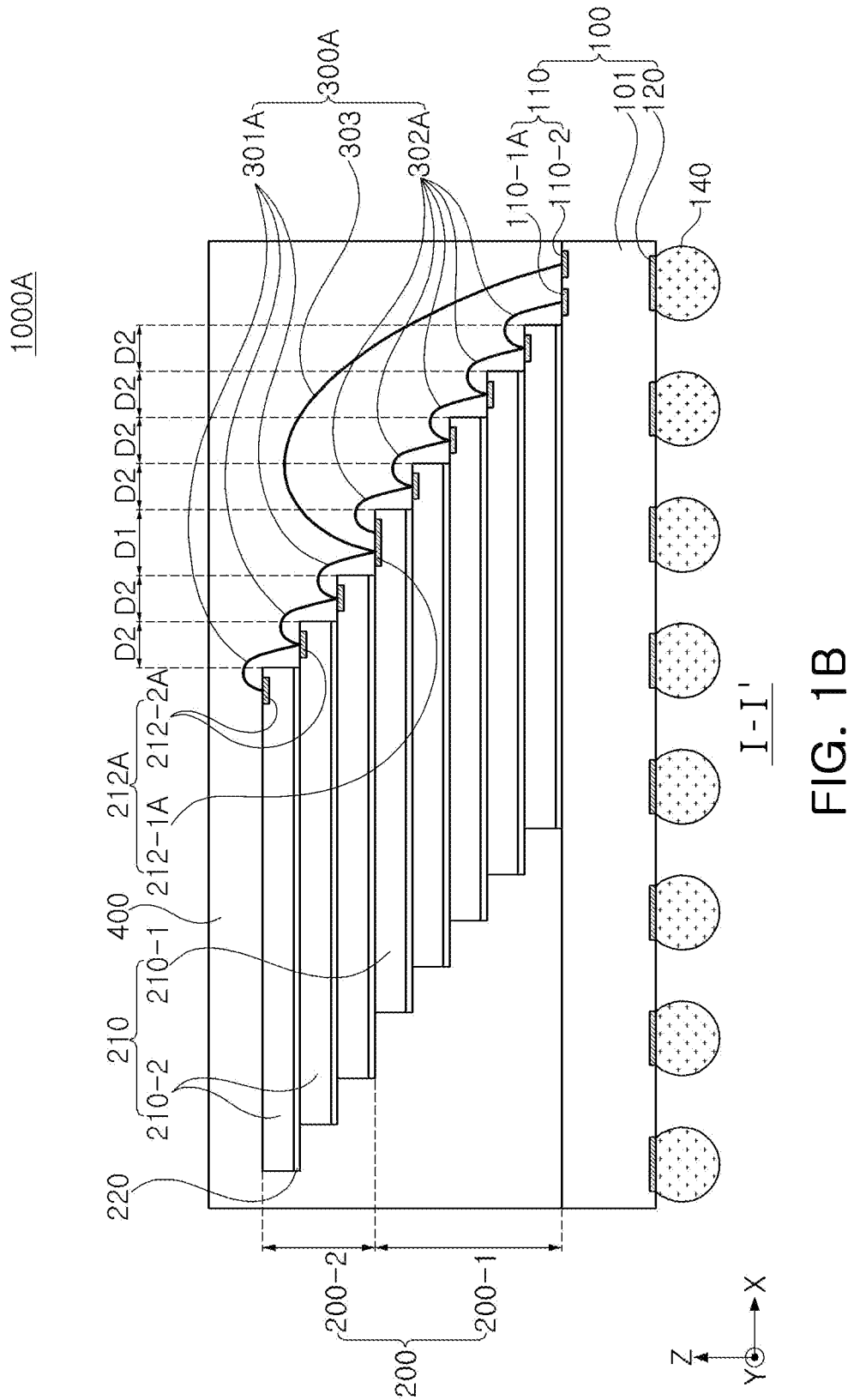

FIGS. 1A and 1B are a plan view and a cross-sectional view, respectively, of a semiconductor package according to an example embodiment.

FIG. 1A is a plan view of a semiconductor package 1000A according to an example embodiment, and FIG. 1B is a cross-sectional view illustrating a region corresponding to a cross-sectional surface taken along line I-I' of FIG. 1A.

Referring to FIGS. 1A and 1B, a semiconductor package 1000A according to an example embodiment includes a base substrate 100, a semiconductor chip stack 200 including a plurality of semiconductor chips 210, and bonding wire structures 300. The semiconductor package 1000A may further include an encapsulant 400.

In example embodiments, the base substrate 100 may be a printed circuit board (PCB) or a glass substrate. For example, the base substrate 100 may include a rigid PCB, a flexible PCB, or a rigid-flexible PCB. Also, the base substrate 100 may be a double-sided PCB or a multilayer PCB.

The base substrate 100 may include a core board 101, an upper connection pad 110 disposed on an upper portion or upper surface of the core board 101, a lower connection pad 120 disposed on a lower portion or lower surface of the core board 101, and a wiring structure electrically connecting the upper connection pad 110 and the lower connection pad 120 to each other.

In another example, the base substrate 100 may be an interposer substrate. For example, the base substrate 100 may be a silicon interposer substrate or a redistribution interposer substrate.

The upper connection pad 110 may be disposed on an upper surface of the base substrate 100. The upper connection pad 110 may be disposed to be embedded in the base substrate 100, but example embodiments are not limited thereto. The upper connection pad 110 may serve to electrically connect the semiconductor chip stack 200, disposed on the base substrate 100, and the base substrate 100 to each other. For example, the upper connection pad 110 may be connected to the semiconductor chip stack 200, disposed on the base substrate 100, through the bonding wire structures 300.

The upper connection pad 110 may include first connection portions 110-1A and 110-1B and a second connection portion 110-2. In plan view, the first connecting portions 110-1A and 110-1B and the second connecting portion 110-2 may be spaced apart from each other. The upper connection pad 110 may be embedded in or on the base substrate 100, and an additional layer may be formed on the base substrate 100 to divide the upper connection pad 110 into the first connection portion 110-1A and the second connection portion 110-2.

The upper connection pad 110 may be referred to as a connection pad or a finger pad.

The lower connection pad 120 may be disposed on the lower surface of the base substrate 100. The lower connection pad 120 may serve to electrically connect an external terminal 140 and the base substrate 100 to each other.

The wiring structure may serve to electrically connect the upper connection pad 110 and the lower connection pad 120 to each other. The wiring structure may serve to electrically connect devices, disposed on the base substrate 100, and the external terminal 140 to each other.

The external terminal 140 may electrically connect the semiconductor package 1000A, including the base substrate 100, and another semiconductor package to each other. The external terminal 140 may be in contact with the lower connection pad 120. In the drawings, the external terminal 140 is illustrated as being a solder ball, but example embodiments are not limited thereto. The external terminal 140 may be, for example, a solder bump, a grid array, a conductive tab, or the like. The external terminal 140 may include a plurality of external terminals 140 formed on the lower surface of the base substrate 100.

The semiconductor chip stack 200 may include a plurality of semiconductor chips 210 stacked on the base substrate 100. The plurality of semiconductor chips 210 may be mounted on the base substrate 100.

Each of the plurality of semiconductor chips 210 may include a semiconductor substrate. The semiconductor substrate may include, for example, silicon (Si). Alternatively, the semiconductor substrate may include a semiconductor element such as germanium (Ge), or a compound semiconductor such as silicon carbide (SiC), gallium arsenide (GaAs), indium arsenide (InAs), and indium phosphide (InP). The semiconductor substrate may have an active surface and an inactive surface opposing the active surface. Each of the plurality of semiconductor chips 210 may include a semiconductor device including various types of a plurality of discrete devices formed on the active surface.

In an example embodiment, at least one of the plurality of semiconductor chips 210 may be a central processing unit (CPU), a microprocessor unit (MPU), a graphics processor unit (GPU), or an application processor (AP). In some embodiments, at least one of the plurality of semiconductor chips 210 may be a nonvolatile memory semiconductor chip such as a flash memory, a phase-change random access memory (PRAM), a magnetoresistive random access memory (MRAM), a ferroelectric random access memory (FeRAM), or a resistive random access memory (RRAM). The flash memory may be, for example, a V-NAND flash memory. In an example embodiment, at least one of the plurality of semiconductor chips 210 may be a volatile memory semiconductor chip such as a dynamic random access memory (DRAM) or a static random access memory (SRAM). In an example embodiment, at least one of the plurality of semiconductor chips 210 may be a controller semiconductor chip for controlling the nonvolatile memory semiconductor chip. In an example embodiment, at least one of the plurality of semiconductor chips 210 may be a dummy silicon spacer chip for supporting the remaining semiconductor chips among the plurality of semiconductor chips 210.

In an example embodiment, all of the plurality of semiconductor chips 210 may be or have the same type. For example, each of the plurality of semiconductor chips 210 may include a nonvolatile memory such as a flash memory having substantially the same standard and substantially the same storage capacity. The plurality of semiconductor chips 210 may have substantially the same size. For example, the plurality of semiconductor chips 210 may have substantially the same horizontal width, the same horizontal length, and the same thickness.

The plurality of semiconductor chips 210 may include a plurality of pads 212 disposed on the active surface. For example, the plurality of pads 212 may be disposed on an upper surface of each of the plurality of semiconductor chips 210. The plurality of pads 212 may be disposed to be embedded in the plurality of semiconductor chips 210, but example embodiments are not limited thereto. The plurality of pads 212 may be electrically connected to the pads 212 of adjacent semiconductor chip(s) 210. The pads 212 may include a conductive layer such as a metal, metal nitride, conductive carbon, or combinations thereof. For example, the pads 212 may include Cu, Co, Al, Sn, Ni, Au, Ag, W, WN, Ti, TiN, Ta, TaN, Ru, Pt, or combinations thereof. The pads 212 may be electrically connected to active/passive devices included in each of the plurality of semiconductor chips 210.

The plurality of semiconductor chips 210 may be sequentially stacked using an adhesive layer 220. The adhesive layer 220 may be disposed on the inactive surface of the plurality of semiconductor chips 210. The adhesive layer 220 may be disposed on a lower surface of each of the plurality of semiconductor chips 210. The adhesive layer 220 may include a die attach film (DAF) or a film over wire (FOW). The adhesive layer 220 may serve to increase adhesive strength between the plurality of semiconductor chips 210. The adhesive layer 220 may insulate a plurality of adjacent semiconductor chips 210 from each other. However, in some embodiments, the adhesive layer 220 may be omitted.

The plurality of semiconductor chips 210 may be stacked in a Z-axis direction, perpendicular to the upper surface of the base substrate 100. Each of the plurality of semiconductor chips 210 may be stacked to be offset in an X-axis direction. That is, the plurality of semiconductor chips 210 may be arranged in a staircase or stepped shape to have a cascade structure. Accordingly, one of the plurality of semiconductor chips 210 may be stacked to be offset in the X-axis direction with respect to adjacent one(s) of the plurality of semiconductor chips 210. That is, the plurality of semiconductor chips 210 may be sequentially aligned to be offset in a horizontal direction (e.g., the X-axis direction).

The semiconductor chip stack 200 may include a lower semiconductor chip stack 200-1 and an upper semiconductor chip stack 200-2 disposed on the lower semiconductor chip stack 200-1.

In an example embodiment, the semiconductor chip stack 200 may include '2n+2' semiconductor chips 210. In the semiconductor chip stack 200, the upper semiconductor chip stack 200-2 may include 'n' semiconductor chips 210 and the lower semiconductor chip stack 200-1 may include 'n+2' semiconductor chips 210 (where 'n' may be a positive integer of 3 or more). However, the number of the plurality of semiconductor chips 210 is not limited thereto. Also, the number of the semiconductor chips 210 of each of the upper semiconductor chip stack 200-2 and the lower semiconductor chip stack 200-1 is not limited thereto.

The plurality of semiconductor chips 210 may include a first semiconductor chip 210-1, disposed at or on an uppermost portion of the lower semiconductor chip stack 200-1, and second semiconductor chips 210-2 being remaining semiconductor chips.

A first offset distance D1 between the first semiconductor chip 210-1 and a lowermost semiconductor chip 210 of the upper semiconductor chip stack 200-2 may be greater than a second offset distance D2 between adjacent semiconductor chips 210 of the lower semiconductor chip stack 200-1 and/or between adjacent semiconductor chips 210 of the upper semiconductor chip stack 200-2. The second offset distance D2 may be constant. For example, the semiconductor chip stack 200 may have a constant horizontal offset distance except for a horizontal offset between the lower semiconductor chip stack 200-1 and the upper semiconductor chip stack 200-2. For example, the first offset distance D1 may be within a range of about 325 μm to about 350 μm, and the second offset distance D2 may be about 300 μm. A difference between the first offset distance D1 and the second offset distance D2 may correspond to a difference between a length of a first pad 212-1A of the first semiconductor chip 210-1 and a length of a first pad 212-2A of the second semiconductor chip 210-2 to be described below.

The plurality of pads 212 may be disposed on an upper surface exposed as the plurality of semiconductor chips 210 are aligned to be offset. For example, the plurality of pads 212 may be disposed in a portion, aligned to be offset between each of the plurality of semiconductor chips 210 and an adjacent semiconductor chip 210, of upper surfaces of the plurality of semiconductor chips 210.

The plurality of pads 212 may be aligned to be arranged on the semiconductor chip stack 200 in a predetermined direction. The predetermined direction may correspond to a direction in which the plurality of pads 212 extend along a side surface of the cascade structure of the semiconductor chip stack 200, or a direction in which corner portions of each of the plurality of semiconductor chips 210 are connected to each other. However, the predetermined direction is not limited thereto and may vary according to example embodiments.

The plurality of pads 212 may include first pads 212A, aligned in the predetermined direction (e.g., the X-axis direction), and second pads 212B spaced apart from the first pads in the Y-axis direction. For example, the second pads 212B may be aligned in the predetermined direction while being spaced apart from the first pads 212A in the Y-axis direction.

The first pads 212A may be power pads or ground pads, and the second pads 212B may be signal pads.

The first pads 212A may include a first pad 212-1A, disposed on the first semiconductor chip 210-1, and a first pad 212-2A disposed on the second semiconductor chip 210-2.

The first pad 212-1A, disposed on the first semiconductor chip 210-1, may have a planar area larger than a planar area of each of the first pads 212-2A disposed on the second semiconductor chips 201-2. For example, the first pad 212-2A of the second semiconductor chips 210-2 may be in the form of a square of which both sides have a length ranging from about 20 μm to about 80 μm. For example, first pad 212-1A of the first semiconductor chips 210-1 may be in the form of rectangle of which a length of one side has a length ranging from about 20 μm to about 80 μm, and a length of the other side has a length ranging from about 30 μm to about 120 μm. For example, lengths of sides of the first pads 212-1A and 212-2A of the first and second semiconductor chips 210-1 and 210-2 in the Y-axis direction may be the same, and a length of a side of the first pad 212-1A of the first semiconductor chip 210-1 in the X-axis direction may be as large as about 1.3 times to about 1.7 times a length of a side of the first pad 212-2A of the second semiconductor chip 210-2 in the X-axis direction. Accordingly, an area of the first pad 212-1A of the first semiconductor chip 210-1 may be larger than an area of the first pad 212-2A of the second semiconductor chip 210-2. However, shapes of the first pad 212-1A of the first semiconductor chip 210-1 and the first pad 212-2A of the second semiconductor chip 210-1 are not limited to the above-mentioned rectangular or square shape, and may vary according to example embodiments.

The second pads 212B may include a second pad 212-1B, disposed on the first semiconductor chip 210-1, and second pads 212-2B disposed on the second semiconductor chips 210-2.

The second pad 212-1B, disposed on the first semiconductor chip 210-1, may have the same size and area as the first pad 212-1A disposed on the first semiconductor chip 210-1, but example embodiments are not limited thereto. For example, the second pad 212-1B, disposed on the first semiconductor chip 210-1, may have the same size as the second pad 212-2B disposed on the second semiconductor chips 210-2.

Each of the second pads 212-2B, disposed on the second semiconductor chips 210-2, may have the same size and area as the first pad 212-2A disposed on the second semiconductor chip 210-2.

In FIGS. 1A and 1B, only one first semiconductor chip 210-1 is illustrated, but example embodiments are not limited thereto. In various embodiments, a plurality of first semiconductor chips 210-1 may be provided.

The bonding wire structures 300 may be formed on one side of the semiconductor chip stack 200. The bonding wire structures 300 may electrically connect the semiconductor chips 210 to each other. The bonding wire structures 300 may be in contact with the plurality of pads 212 and the connection pad 110 to electrically connect a plurality of adjacent semiconductor chips 210 to each other and to electrically connect some of the plurality of semiconductor chips 210 and the base substrate 100 to each other. The bonding wire structures 300 may include a conductive material such as a metal material. For example, the bonding wire structures 300 may include gold (Au), silver (Ag), or the like.

The bonding wire structures 300 may include a first bonding wire structure 300A and a second bonding wire structure 300B. The first bonding wire structure 300A may electrically connect the first pads 212A and the connection pad 110 to each other. The second bonding wire structure 300B may electrically connect the second pads 212B and the connection pad 110 to each other.

The total number of bonding wires of the first bonding wire structure 300A may be greater than the total number of bonding wires of the second bonding wire structure 300B.

The bonding wire structure 300A may include first bonding wires 301A connecting first pads 212-2A of adjacent semiconductor chips 210-2 of the upper semiconductor chip stack 200-2 to each other and connecting a first pad 212-2A of a lowermost semiconductor chip 210-2 of the upper semiconductor chip stack 200-2 and the first pad 212-1A of the first semiconductor chip 210-1 to each other, second bonding wires 302A connecting first pads 212-2A of adjacent semiconductor chips 210-2 of the lower semiconductor chip stack 200-1 to each other and connecting a first pad 212-2A of a lowermost semiconductor chip 210-2 of the lower semiconductor chip stack 200-1 and the base substrate 100 to each other, and a third bonding wire 303 connecting the first semiconductor chip 210-1 and the base substrate 100 to each other. The second bonding wires 302A may also connect the first pad 212-1A of the first semiconductor chip 210-1 and the first pad 212-2A of the adjacent semiconductor chip 210-2 of the lower semiconductor chip stack 200-1 to each other.

The second bonding wire structure 300B may include fourth bonding wires 301B connecting second pads 212-2B of adjacent semiconductor chips 210-2 of the upper semiconductor chip stack 200-2 to each other and connecting a second pad 212-2B of a lowermost semiconductor chip 210-2 of the upper semiconductor chip stack 200-2 and the second pad 212-1B of the first semiconductor chip 210-1 to each other, and fifth bonding wires 302B connecting second pads 212-2B of adjacent semiconductor chips 210-2 of the lower semiconductor chip stack 200-1 to each other and connecting a second pad 212-2B of a lowermost semiconductor chip 210-2 of the lower semiconductor chip stack 200-1 and the base substrate 100 to each other. The fifth bonding wires 302B may also connect the second pad 212-1B of the first semiconductor chip 210-1 and the second pad 212-2B of the adjacent semiconductor chip 210-2 of the lower semiconductor chip stack 200-1 to each other.

The first bonding wires 301A or the fourth bonding wires 301B may serve to electrically connect adjacent semiconductor chips 210, disposed in the upper semiconductor chip stack 200-2, to each other and to electrically connect the upper and lower semiconductor chip stacks 200-1 and 200-2 to each other.

The second bonding wires 302A or the fifth bonding wires 302B may serve to electrically connect adjacent semiconductor chips 210, disposed in the lower semiconductor chip stack 200-2, to each other and to electrically connect the lower semiconductor chip stack 200-1 and the base substrate 100 to each other.

One side or end of the third bonding wire 303 may be in contact with the first pad 212-1A of the first semiconductor chip 210-1, and an opposing side or end of the third bonding wire 303 may be in contact with the base substrate 100. The opposing side of the third bonding wire 303 may be in contact with the connection pad 110 of the base substrate 100. The third bonding wire 303 may directly connect the semiconductor chips 210 of the upper semiconductor chip stack 200-2 to the base substrate 100. The third bonding wire 303 may connect the upper semiconductor chip stack 200-2 to the base substrate 100 through a single bonding wire without passing through the second bonding wires 302A to the fifth bonding wires 302B. The third bonding wire 303 may be a wire having a length smaller than the sum of lengths of the second bonding wires 302A. Accordingly, a value of resistance generated by the bonding wire between the upper semiconductor chip stack 200-2 and the base substrate 100 may be reduced to address a power integration (PI) issue.

The second bonding wires 302A and the third bonding wire 303 may be electrically connected to each other in parallel.

The first bonding wires 301A and the third bonding wire 303 may be in contact with each other. A lowermost bonding wire of the first bonding wires 301A and the third bonding wire 303 may be in contact with each other at or in the first pad 212-1A disposed on the first semiconductor chip 210-1. The first pad 212-1A of the first semiconductor chip 210-1 may have a front region, close to a side surface of the first semiconductor chip 210-1, and a rear region opposing to the front region. Among the first bonding wires 301A, the lowermost first bonding wire 301A and the third bonding wire 303 may be in contact with each other in the rear region. Among the second bonding wires 302A, an uppermost second bonding wire 302A may be in contact with the front region. That is, the first bonding wire 301A and the third bonding wire 303 may not be in contact with the second bonding wire 302A.

The upper connection pad 110, connected to the first bonding structures 300A, may be divided into a first connection portion 110-1A and a second connection portion 110-2. The upper connection pad 110, connected to the second bonding structures 300B, may include only the first connection portion 110-1B.

The first connection portions 110-1A and 110-1B may be portions in contact with a bonding wire connecting the lowermost semiconductor chip 210, among the plurality of semiconductor chips 210, and the base substrate 100 to each other. The first connection portions 110-1A or 110-1B may be a portion 110-1A in contact with a lowermost second bonding wire, among the second bonding wires 302A, or a portion 110-1B in contact with a lowermost fifth bonding wire, among the fifth bonding wires 302B.

The second connection portion 110-2 may be a portion in contact with a bonding wire connecting the uppermost semiconductor chip 210-1 of the lower semiconductor chip stack 200-1 and the base substrate 100 to each other. The second connection portion 110-2 may be a portion in contact with the third bonding wire 303.

The encapsulant 400 may cover at least a portion of the semiconductor chip stack 200 on the base substrate 100. In an example embodiment, the encapsulant 400 may be formed to cover side surfaces and upper portions of the semiconductor chip stack 200 and the bonding wire structures 300. Side surfaces of the encapsulant 400 and the base substrate 100 may be substantially in the same plane or be coplanar. The encapsulant 400 may be formed by, for example, curing an epoxy molding compound (EMC). The encapsulant 400 may protect the semiconductor chip stack 200, and the like, from factors of external environments such as physical impact, moisture, or the like.

Although not illustrated, the semiconductor package 1000A according to an example embodiment may further include at least one semiconductor chip, in addition to the plurality of semiconductor chips 210 disposed in the semiconductor chip stack 200. The at least one semiconductor chip may be or have the same type as the plurality of semiconductor chips 210. However, example embodiments are not limited thereto, and the at least one semiconductor chip may include other devices. The at least one semiconductor chip may be disposed between a lower surface of the semiconductor chip stack 200 and the base substrate 100. However, example embodiments are not limited thereto, and the at least one semiconductor chip may be disposed in various positions such as an upper surface, a side surface, and the like, of the semiconductor chip stack 200.

Figure 2:
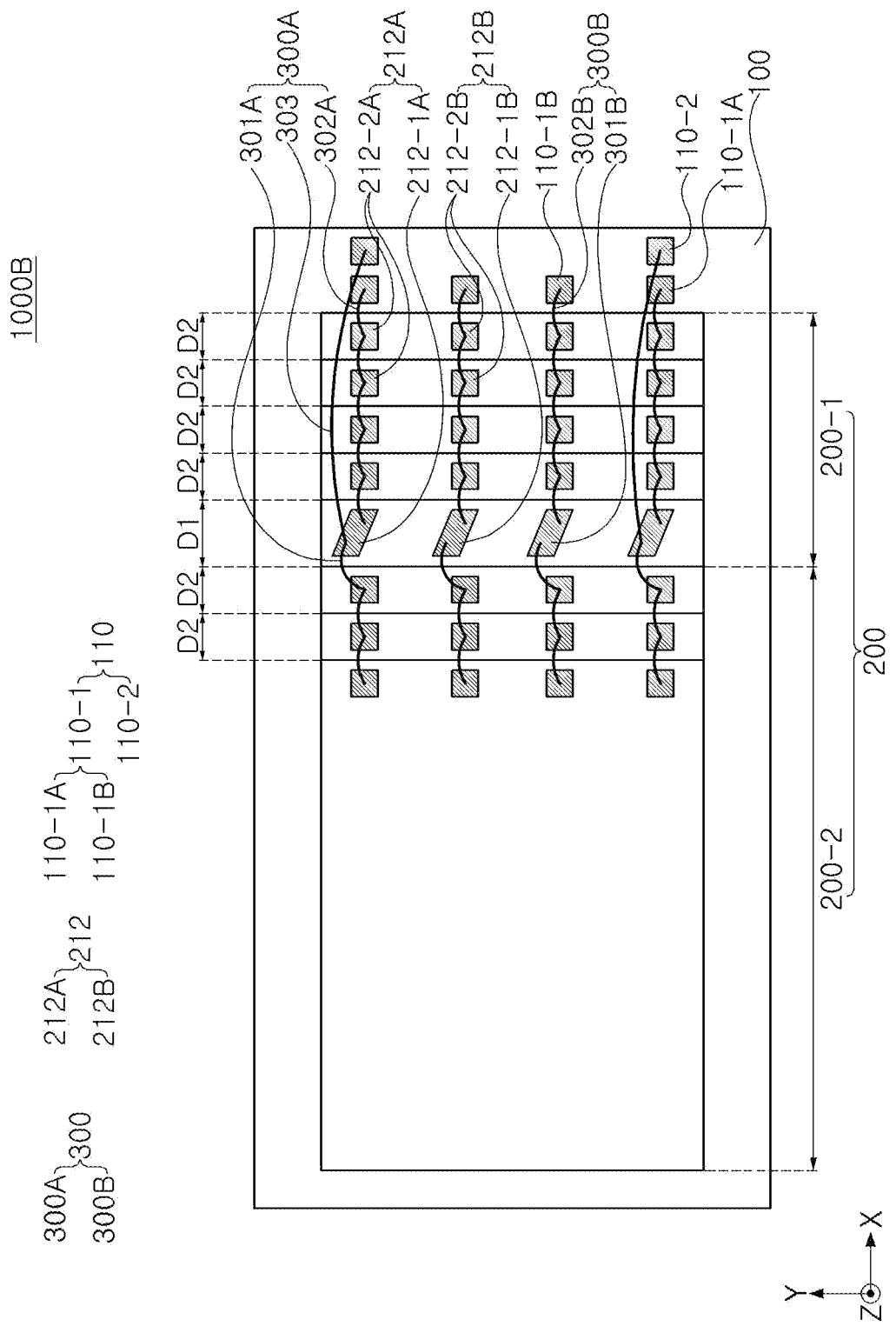
FIG. 2 is a plan view of a semiconductor package according to an example embodiment.

FIG. 2 is a plan view of a semiconductor package 1000B according to an example embodiment.

Referring to FIG. 2, a semiconductor package 1000B according to an example embodiment may be understood to have the same features as or similar features as the semiconductor package 1000A illustrated in FIG. 1, except for pads 212-1A, 212-1B of a first semiconductor chip 210-1 and bonding wire structures 300. Accordingly, repeated or redundant descriptions of the contents described with reference to FIGS. 1A and 1B may be omitted in the interest of brevity.

In a plan view of the semiconductor package 1000B according to the present embodiment, the pads 212-1A and 212-1B of the first semiconductor chip 210-1 may have a parallelogram shape, rather than a rectangular shape. According to example embodiments, the second pad 212-1B of the first semiconductor chip 210-1 may have the same square shape as the second pad 212-2B of the second semiconductor chip 210-2.

In the semiconductor package 1000B according to the present embodiment, the first pad 212-1A of the first semiconductor chip 210-1 may have a first side, parallel to a Y-axis direction, and a second side, extending in a direction of an acute angle of 90 degrees or less relative to the X-axis direction, unlike the example embodiment of FIG. 1. The first side of the first pad 212-1A may be aligned with the first pads 212-2A of the second semiconductor chips 210-2, but a side facing or opposing the first side may be disposed to be offset in the Y-axis direction.

The third bonding wire 303 may be in contact with the first pad 212-1A in a region, adjacent to the side facing the first side, of the first pads 212-1A of the first semiconductor chip 210-1. Accordingly, as compared with the example embodiment of FIG. 1, a distance between the third bonding wire 303 and the second bonding wires 302A may be increased to prevent defects caused by contact between the bonding wires 302A and 303.

In FIG. 2, the first pad 212-1A of the first semiconductor chip 210-1 are illustrated as having a parallelogram shape, but a shape thereof is not limited thereto. Pads having various shapes, allowing a distance between the bonding wires 302A and 303 to be increased, may be employed. For example, the first pad 212-1A of the first semiconductor chip 210-1 may have an "L" shape, a "C" shape, or the like.

Figure 3A:
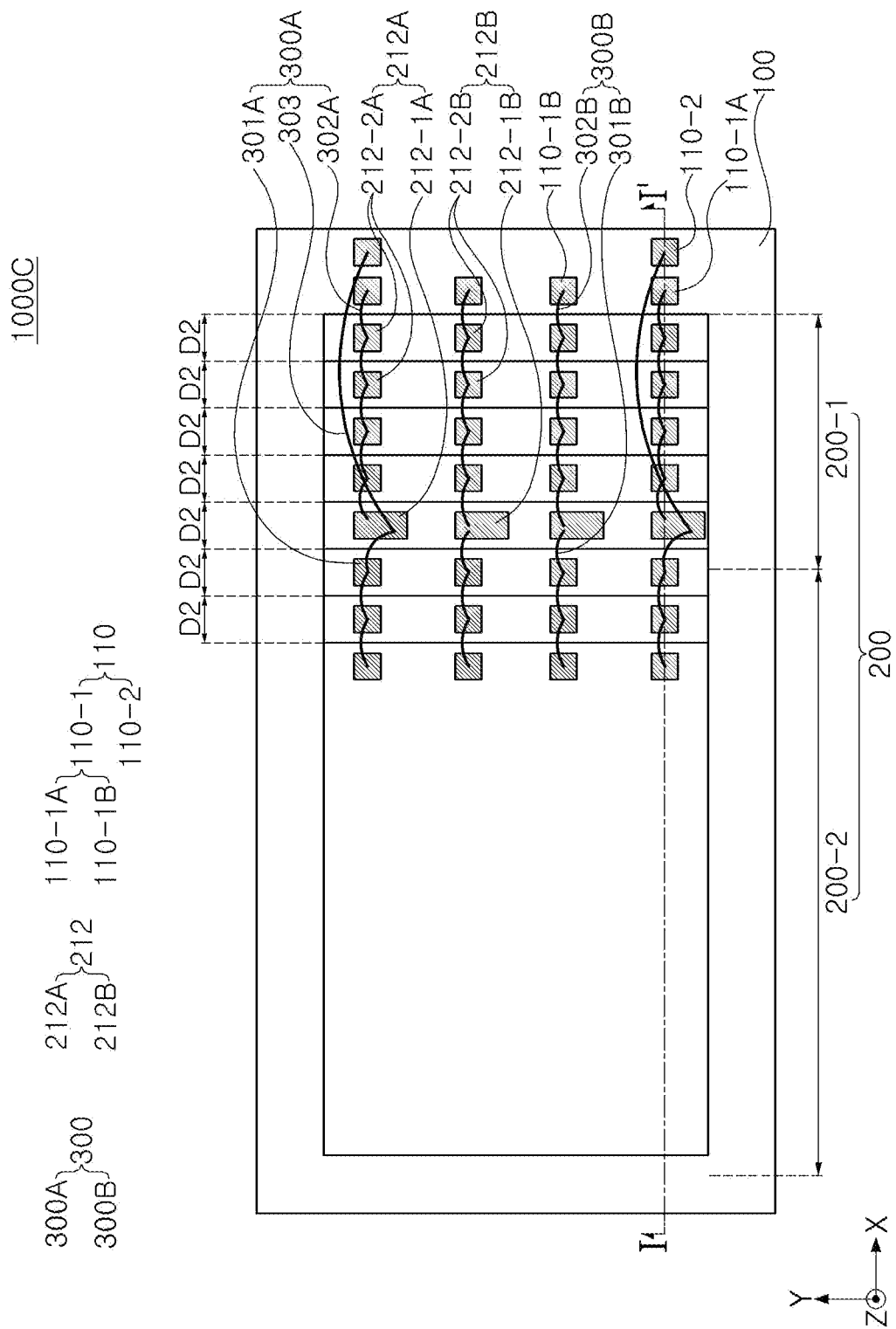
FIGS. 3A and 3B are a plan view and a cross-sectional view, respectively, of a semiconductor package according to an example embodiment.
Figure 3B:
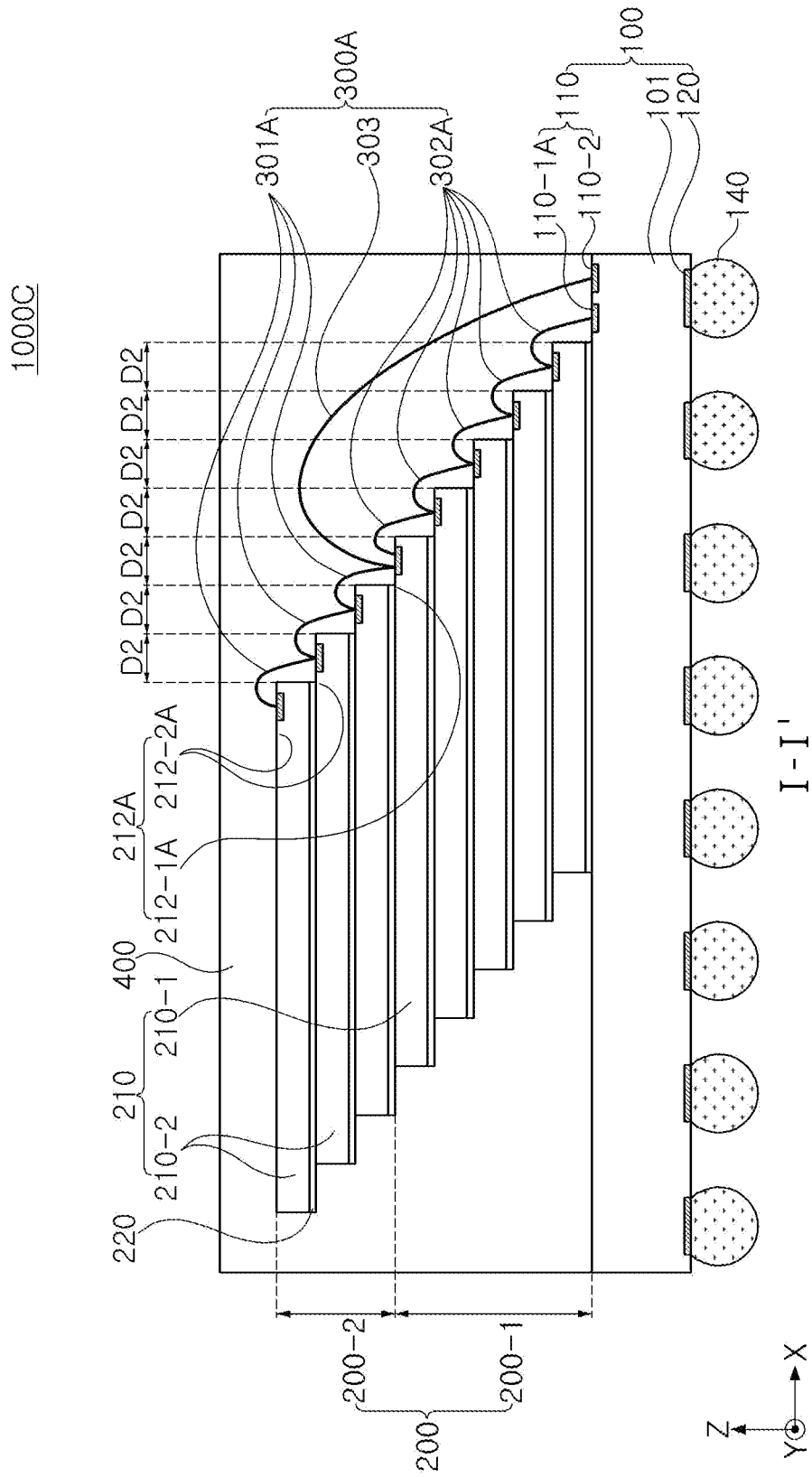

FIG. 3A is a plan view of a semiconductor package 1000C according to an example embodiment, and FIG. 3B is a cross-sectional view illustrating a region corresponding to a cross-sectional surface taken along line I-I' of FIG. 3A.

Referring to FIGS. 3A and 3B, the semiconductor package 1000C according to an example embodiment may be understood to have the same features as or similar features to the semiconductor package 1000A illustrated in FIG. 1, except for pads 212-1A, 212-1B, bonding wire structures 300, and an offset structure of a plurality of semiconductor chips 210 with regard to first semiconductor chip 210-1. Accordingly, repeated or redundant descriptions of the contents described with reference to FIGS. 1A and 1B may be omitted in the interest of brevity.

In the semiconductor package 1000C according to the present embodiment, offset distances of the plurality of semiconductor chips 210 may be constant. For example, a first offset distance D1 and a second offset distance D2 may be the same. Accordingly, a semiconductor chip stack 200 may have a cascade structure in which semiconductor chips are sequentially stacked to be horizontally offset by a constant distance on a base substrate 100.

Referring to FIG. 3A, in the semiconductor package 1000C according to the present embodiment, the first semiconductor chip 210-1A may include a first pad 212-1A having a rectangular shape having a longer length in the Y-axis direction than in the X-axis direction, in plan view. That is, a side of the first pad 212-1A of the first semiconductor chip 210-1 may have the same length as a side of each of the first pads 212-2A of the second semiconductor chips 210-2 in the X-axis direction, and may have a length greater than a length of a side of each of the first pads 212-2A of the second semiconductor chips 210-2 in the Y-axis direction.

In the semiconductor package 1000C according to the present embodiment, the third bonding wire 303 may be in contact with the first pad 212-1A of the first semiconductor chip to be offset in the Y-axis direction, unlike the first and second bonding wires disposed to be aligned. Accordingly, as compared with the example embodiment of FIG. 1, a distance between the third bonding wire 303 and the second bonding wires 302A may be increased to prevent defects caused by contact between the bonding wires 302A and 303. However, effects according to the present embodiment are not limited thereto.

Figure 4:
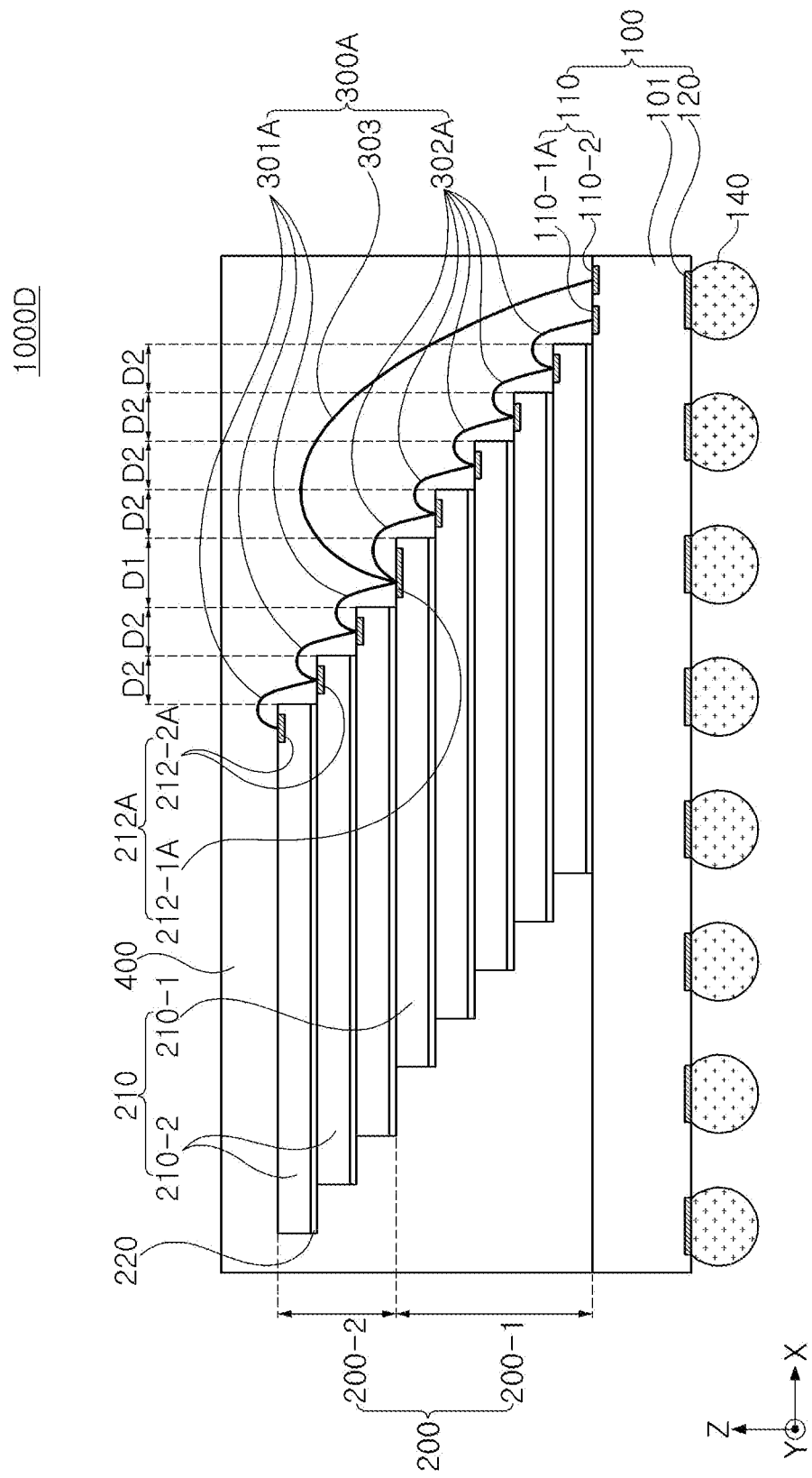
FIG. 4 is a cross-sectional view of a semiconductor package according to an example embodiment.

FIG. 4 is a cross-sectional view of a semiconductor package 1000D according to an example embodiment.

Referring to FIG. 4, the semiconductor package 1000D according to an example embodiment may be understood to have the same features as or similar features to the semiconductor package 1000A illustrated in FIGS. 1A and 1B, except for a connection relationship between bonding wire structures 300.

In the semiconductor package 1000D according to the present embodiment, a lowermost first bonding wire, among first bonding wires 301A, an uppermost second bonding wire, among second bonding wires 302A, and a third bonding wire 303 may be in contact with each other. For example, one side or end of the first bonding wire, one side or end of the second bonding wire, and one side or end of the third bonding wire 303 may be simultaneously in contact with each other on the first pad 212-1 of the first semiconductor chip 210-1. Accordingly, the second bonding wires 302A and the third bonding wire 303 may be in contact with the first bonding wires 301A without loss of resistance, and a power integrity (PI) issue may be addressed.

Figure 5:
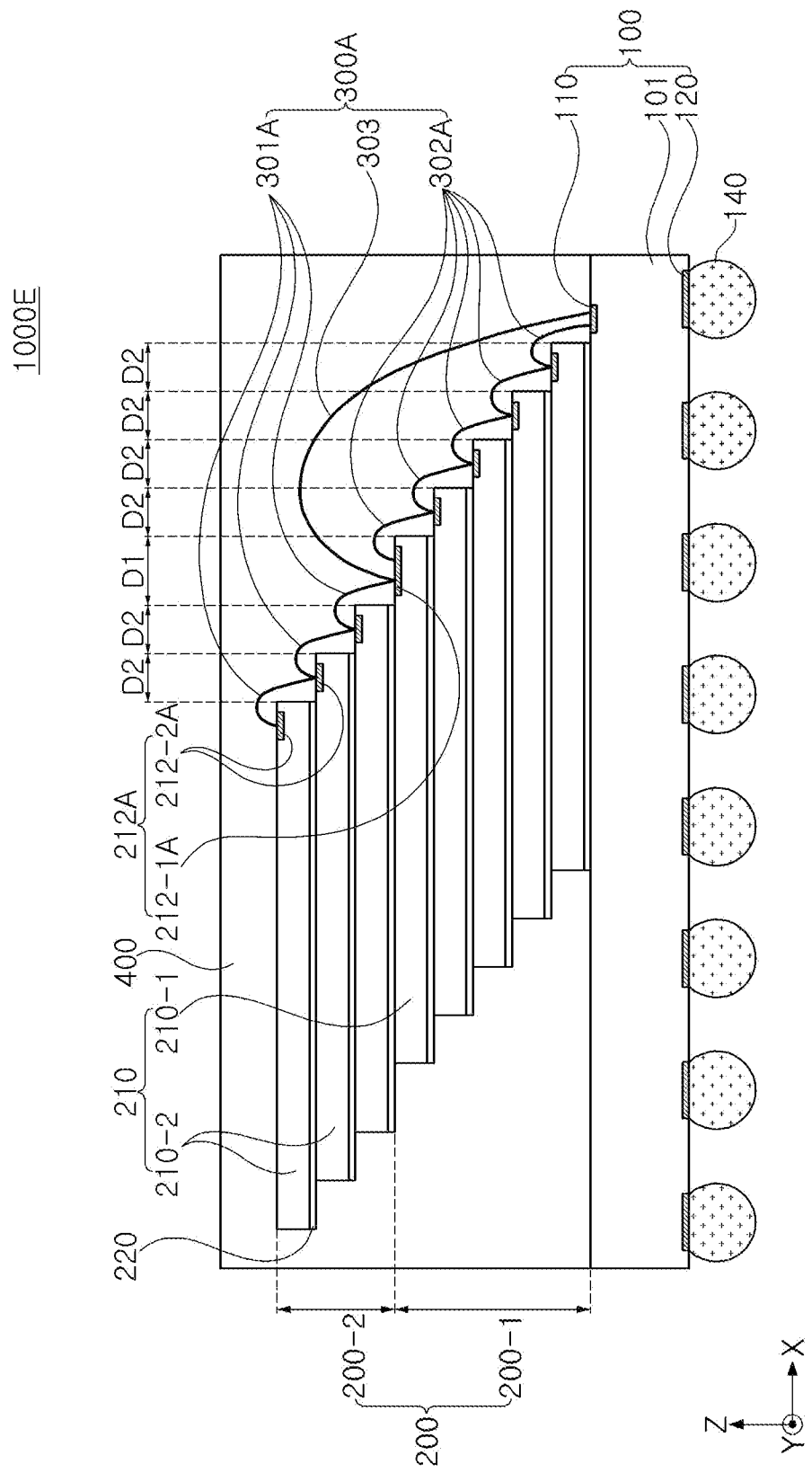
FIG. 5 is a cross-sectional view of a semiconductor package according to an example embodiment.

FIG. 5 is a cross-sectional view of a semiconductor package 1000E according to an example embodiment.

Referring to FIG. 5, a semiconductor package 1000E according to an example embodiment may be understood to have the same features as or similar features to the semiconductor package 1000A illustrated in FIGS. 1A and 1B, except for a connection relationship between an upper connection pad 110 of a base substrate 100 and the bonding wire structures 300.

In the semiconductor package 1000E according to the present embodiment, second bonding wires 302A and the third bonding wire 303 may be in contact with a single upper connection pad 110. For example, a lowermost second bonding wire, among the second bonding wires 302A, and the third bonding wire 303 may be simultaneously in contact with the single upper connection pad 110.

Figure 6:
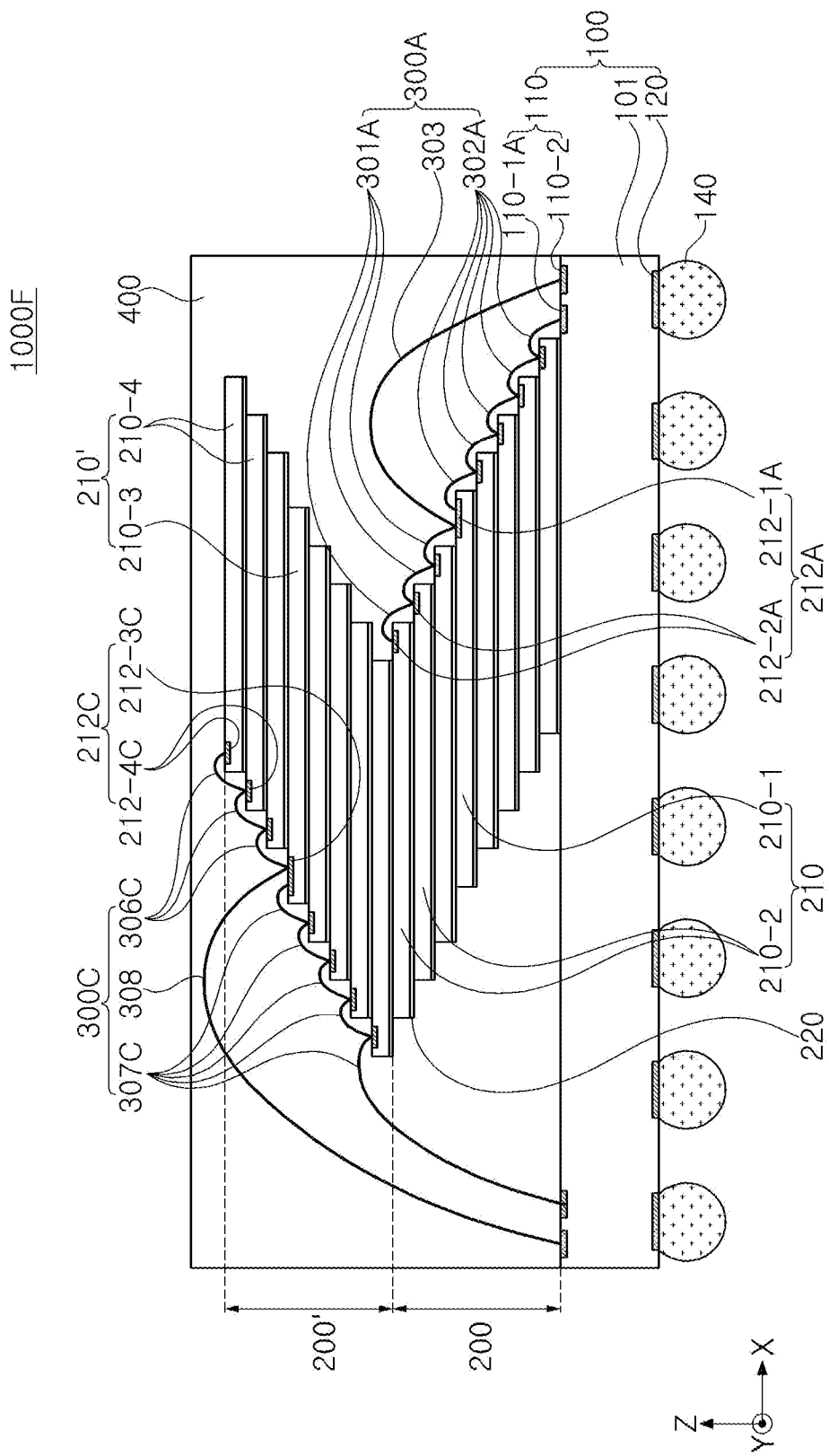
FIG. 6 is a cross-sectional view of a semiconductor package according to an example embodiment.

FIG. 6 is a cross-sectional view of a semiconductor package 1000F according to an example embodiment.

The semiconductor package 1000F according to the present embodiment may further include a semiconductor chip stack 200' disposed on the semiconductor chip stack 200 illustrated in FIGS. 1A and 1B. A semiconductor chip stack 200, disposed on a base substrate 100, may be referred to as a first semiconductor chip stack 200. A semiconductor chip stack, disposed on the first semiconductor chip stack 200, may be referred to as a second semiconductor chip stack 200'.

The first semiconductor chip stack 200 may include a plurality of semiconductor chips 210 stacked in a Z-axis direction and stacked to be offset in an X-axis direction (e.g., a first direction). The second semiconductor chip stack 200' may include a plurality of upper semiconductor chips 210' stacked in the Z-axis direction and stacked to be offset in a direction, opposing the X-axis direction (e.g., a second direction opposite the first direction). A lowermost upper semiconductor chip 210' of the second semiconductor chip stack 200' may be stacked on the first semiconductor chip stack 200 to be offset in the X-axis direction. An offset distance by which the lowermost upper semiconductor chip 210' of the second semiconductor chip stack 200' is offset from the first semiconductor chip stack 200 may be the same as the second offset distance D2 described with reference to FIG. 1.

The second semiconductor chip stack 200' may include a first upper semiconductor chip stack and a second upper semiconductor chip stack disposed on the first upper semiconductor chip stack. A plurality of upper semiconductor chips 210' of the second semiconductor chip stack 200' may include a third semiconductor chip 210-3, disposed in an uppermost portion of the first upper semiconductor chip stack, and fourth semiconductor chips 210-4 being remaining upper semiconductor chips.

Each of the plurality of upper semiconductor chips 210' of the second semiconductor chip stack 200' may include a plurality of upper pads 212' disposed on exposed upper surfaces of the plurality of upper semiconductor chips 210'. The plurality of upper pads 212' of the second semiconductor chip stack 200' may include third pads 212C, aligned in a predetermined direction, and fourth pads 212D spaced apart from the third pads 212C in a Y-axis direction. The predetermined direction may be a direction in which plurality of upper pads 212' extend along a side surface of a cascade structure of the second semiconductor chip stack 200', or a direction in which side corner portions of each of the plurality of upper semiconductor chips 210' of the second semiconductor chip stack 200' are connected to each other.

The third pad 212-3C, disposed on the third semiconductor chip 210-3, may have a planar area larger than a planar area of each of the third pads 212-4C disposed on the fourth semiconductor chips 210-4.

Bonding wire structures 300, electrically connecting the second semiconductor chip stacks 200' to each other, may include a third bonding wire structure 300C and a fourth bonding wire structure 300D.

The third bonding wire structure 300C may include sixth bonding wires 306C connecting third pads 212-4C of adjacent upper semiconductor chips 210' of the second upper semiconductor chip stack to each other and connecting a third pad 212-4C of a lowermost upper semiconductor chip 210' of the second upper semiconductor chip stack and a third pad 212-3C of the third semiconductor chip 210-3, seventh bonding wires 307C connecting third pads 214-4C of adjacent upper semiconductor chips 210' of the first upper semiconductor chip stack to each other and connecting third pads 212-4C of a lowermost upper semiconductor chip 210' of the first upper semiconductor chip stack to each other, and an eighth bonding wire 308 connecting a third pad 212-3C of the third semiconductor chip 210-3 and the base substrate 100 to each other. The seventh bonding wires 307C may connect a third pad 212-4C of an uppermost upper semiconductor chip 210' of the first upper semiconductor chip stack and the third pad 212-3C of the third semiconductor chip 210-3. The seventh bonding wires 307C may connect a third pad 212-4C of the lowermost upper semiconductor chip 210' of the first upper semiconductor chip stack and the base substrate 100 to each other.

A method of stacking the plurality of upper semiconductor chips 210' on the second semiconductor chip stack 200' is not limited to the above-described method. For example, the plurality of upper semiconductor chips 210' may be stacked in the X-axis direction in the same manner as the first semiconductor chip stack 200, or may be stacked in a zigzag pattern.

As described above, in a plurality of semiconductor chips stacked in multiple stages, a long pad may be disposed on some semiconductor chips and a bonding wire, directly connected to a base substrate, may be added. Thus, a semiconductor package having improved power integrity (PI) may be provided.

While example embodiments have been shown and described above, it will be apparent to those skilled in the art that modifications and variations could be made without departing from the scope of the present inventive concept as defined by the appended claims.

What is claimed is:

1. A semiconductor package comprising:
a base substrate;
a semiconductor chip stack including a plurality of semiconductor chips stacked on the base substrate in a first direction, perpendicular to an upper surface of the base substrate and each having an upper surface on which a plurality of pads are disposed; and
bonding wire structures electrically connecting the base substrate and the semiconductor chips,
wherein the semiconductor chip stack includes a lower semiconductor chip stack and an upper semiconductor chip stack on the lower semiconductor chip stack,
the plurality of semiconductor chips include a first semiconductor chip at an uppermost portion of the lower semiconductor chip stack, and second semiconductor chips being the remaining semiconductor chips among the plurality of semiconductor chips,
the plurality of pads include first pads, aligned in a second direction, and second pads, spaced apart from the first pads in a third direction, perpendicular to the first direction and the second direction, and
the first pad, disposed on the first semiconductor chip, has a planar area larger than a planar area of each of the first pads disposed on the second semiconductor chips.

2. The semiconductor package of claim 1, wherein the bonding wire structures include a first bonding wire structure and a second bonding wire structure,
the first bonding wire structure includes first bonding wires connecting the first pads of adjacent semiconductor chips of the upper semiconductor chip stack and connecting the first pad of a lowermost semiconductor chip of the upper semiconductor chip stack and the first pad of the first semiconductor chip, second bonding wires connecting the first pads of adjacent semiconductor chips of the lower semiconductor chip stack and connecting the first pad of a lowermost semiconductor chip of the lower semiconductor chip stack and the base substrate, and a third bonding wire connecting the first pad of the first semiconductor chip and the base substrate, and
the second bonding wire structure includes fourth bonding wires connecting the second pads of adjacent semiconductor chips of the upper semiconductor chip stack and connecting the second pad of a lowermost semiconductor chip of the upper semiconductor chip stack and the second pad of the first semiconductor chip, and fifth bonding wires connecting the second pads of adjacent semiconductor chips of the lower semiconductor chip stack and connecting the second pad of a lowermost semiconductor chip of the lower semiconductor chip stack and the base substrate.

3. The semiconductor package of claim 2, wherein the third bonding wire has a first end and a second end opposing the first end, and
the first end of the third bonding wire is in contact with the first pad of the first semiconductor chip, and the second end of the third bonding wire is in contact with a connection pad of the base substrate.

4. The semiconductor package of claim 3, wherein the first pads include a power pad or a ground pad, and
the second pads include a signal pad.

5. The semiconductor package of claim 2, wherein the first pad of the first semiconductor chip is in contact with three bonding wires, and the second pad of the first semiconductor chip is in contact with two bonding wires.

6. The semiconductor package of claim 2, wherein a lowermost first bonding wire, among the first bonding wires, an uppermost second bonding wire, among the second bonding wires, and the third bonding wire are in contact with each other on the first pad of the first semiconductor chip.

7. The semiconductor package of claim 2, wherein the base substrate includes a connection pad in contact with a lowermost second bonding wire, among the second bonding wires, and the third bonding wire.

8. The semiconductor package of claim 2, wherein the base substrate includes a connection pad including a first connection portion in contact with a lowermost second bonding wire, among the second bonding wires, and a second connection portion in contact with the third bonding wire, and
the first connection portion and the second connection portion are spaced apart from each other.

9. The semiconductor package of claim 1, wherein the plurality of semiconductor chips are offset from one another and stacked in a fourth direction, perpendicular to the first direction and the third direction.

10. The semiconductor package of claim 9, wherein a first offset distance between the first semiconductor chip and a semiconductor chip at a lowermost portion of the upper semiconductor chip stack is greater than a second offset distance between adjacent ones of the remaining semiconductor chips.

11. The semiconductor package of claim 2, wherein the upper semiconductor chip stack includes 'n' semiconductor chips, and the lower semiconductor chip stack includes 'n+2' semiconductor chips,
where 'n' is a positive integer of 3 or more.

12. The semiconductor package of claim 1, wherein an area of the first pad of the first semiconductor chip is about 1.3 times to about 1.7 times larger than an area of each of the first pads of the second semiconductor chips.

13. The semiconductor package of claim 1, wherein the first pad disposed on the first semiconductor chip has a rectangular shape having a minor axis in the third direction and a major axis in a fourth direction, perpendicular to the third direction.

14. The semiconductor package of claim 1, wherein the first pad disposed on the first semiconductor chip has a parallelogram shape.

15. A semiconductor package comprising:
a base substrate;
a first semiconductor chip stack including a plurality of semiconductor chips stacked on the base substrate in a first direction, perpendicular to an upper surface of the base substrate, with the plurality of semiconductor chips offset with respect to one another in a second direction, perpendicular to the first direction; and
bonding wire structures electrically connecting the base substrate and the plurality of semiconductor chips,
wherein the first semiconductor chip stack includes a lower semiconductor chip stack and an upper semiconductor chip stack on the lower semiconductor chip stack,
the plurality of semiconductor chips include a first semiconductor chip at an uppermost portion of the lower semiconductor chip stack, and second semiconductor chips being the remaining semiconductor chips among the plurality of semiconductor chips, the plurality of semiconductor chips includes a plurality of pads disposed on exposed upper surfaces of the plurality of semiconductor chips, the plurality of pads include first pads, aligned in a third direction, and second pads, spaced apart from the first pads in a fourth direction, perpendicular to the first direction and the third direction, the first pad disposed on the first semiconductor chip has a planar area larger than a planar area of each of the first pads disposed on the second semiconductor chips, the bonding wire structures include a first bonding wire structure and a second bonding wire structure, the first bonding wire structure includes a plurality of bonding wires electrically connecting the first pads and the base substrate to each other, the second bonding wire structure includes a plurality of bonding wires electrically connecting the second pads and the base substrate to each other, and the total number of the bonding wires of the first bonding wire structure is greater than the total number of the bonding wires of the second bonding wire structure.

16. The semiconductor package of claim 15, wherein the bonding wires of the first bonding wire structure include first bonding wires connecting the first pads of adjacent semiconductor chips of the upper semiconductor chip stack and connecting the first pad of a lowermost semiconductor chip of the upper semiconductor chip stack and the first pad of the first semiconductor chip, second bonding wires connecting the first pads of adjacent semiconductor chips of the lower semiconductor chip stack and connecting the first pad of a lowermost semiconductor chip of the lower semiconductor chip stack and the base substrate, and a third bonding wire connecting the first pad of the first semiconductor chip and the base substrate, and the bonding wires of the second bonding wire structure include fourth bonding wires connecting the second pads of adjacent semiconductor chips of the upper semiconductor chip stack and connecting the second pad of a lowermost semiconductor chip of the upper semiconductor chip stack and the second pad of the first semiconductor chip, and fifth bonding wires connecting the second pads of adjacent semiconductor chips of the lower semiconductor chip stack and connecting the second pad of a lowermost semiconductor chip of the lower semiconductor chip stack and the base substrate.

17. The semiconductor package of claim 16, wherein the third bonding wire is electrically connected to the second bonding wires in parallel.

18. The semiconductor package of claim 16, further comprising:

a second semiconductor chip stack on the first semiconductor chip stack and including a plurality of upper semiconductor chips stacked in the first direction with the plurality of upper semiconductor chips offset with respect to one another in a direction opposing the second direction; and third and fourth bonding wire structures electrically connecting the plurality of upper semiconductor chips of the second semiconductor chip stack to each other, wherein the second semiconductor chip stack includes a first upper semiconductor chip stack and a second upper semiconductor chip stack on the first upper semiconductor chip stack, the plurality of upper semiconductor chips of the second semiconductor chip stack include a third semiconductor chip at an uppermost portion of the first upper semiconductor chip stack, and fourth semiconductor chips being the remaining upper semiconductor chips, the plurality of upper semiconductor chips of the second semiconductor chip stack includes a plurality of upper pads on exposed upper surfaces of the plurality of upper semiconductor chips, the plurality of upper pads of the second semiconductor chip stack include third pads, aligned in a fifth direction, and fourth pads spaced apart from the third pads in the fourth direction, the third pad disposed on the third semiconductor chip has a planar area larger than a planar area of each of the third pads disposed on the fourth semiconductor chips, the third bonding wire structure includes sixth bonding wires connecting the third pads of adjacent upper semiconductor chips of the second upper semiconductor chip stack and connecting the third pad of a lowermost upper semiconductor chip of the second upper semiconductor chip stack and the third pad of the third semiconductor chip, seventh bonding wires connecting the third pads of adjacent upper semiconductor chips of the first upper semiconductor chip stack and the base substrate and connecting the third pad of a lowermost upper semiconductor chip of the first upper semiconductor chip stack and the base substrate, and an eighth bonding wire connecting the third pad of the third semiconductor chip and the base substrate to each other, and the fourth bonding wire structure includes ninth bonding wires connecting the fourth pads of adjacent upper semiconductor chips of the second upper semiconductor chip stack and connecting the fourth pad of a lowermost upper semiconductor chip of the second upper semiconductor chip stack and the fourth pad of the third semiconductor chip, and tenth bonding wires connecting the fourth pads of adjacent upper semiconductor chips of the first upper semiconductor chip stack and connecting the fourth pad of a lowermost upper semiconductor chip of the first upper semiconductor chip stack and the base substrate.

19. A semiconductor package comprising:

a base substrate;

a plurality of semiconductor chips stacked on the base substrate in a first direction, perpendicular to an upper surface of the base substrate, with the plurality of semiconductor chips offset in a second direction, perpendicular to the first direction, with respect to one another and each having an upper surface on which a first pad is disposed; and a first bonding wire structure electrically connecting the base substrate and the plurality of semiconductor chips, wherein the plurality of semiconductor chips include a first semiconductor chip, a second semiconductor chip, and a third semiconductor chip that are sequentially stacked, the second semiconductor chip and the third semiconductor chip are offset with respect to each other in the second direction by a first distance that is greater than a second distance by which the first semiconductor chip and the second semiconductor chip are offset with respect to each other in the second direction, the first pad of the second semiconductor chip has an area larger than an area of the first pad of each of the first semiconductor chip and the third semiconductor chip, and the first bonding wire structure includes a first bonding wire electrically connecting the first pad of the second semiconductor chip and the first pad of the third semiconductor chip, a second bonding wire electrically connecting the first pad of the first semiconductor chip and the first pad of the second semiconductor chip, and a third bonding wire electrically connecting the first pad of the second semiconductor chip and the base substrate.

20. The semiconductor package of claim 19, wherein each of the plurality of semiconductor chips further includes a second pad spaced apart from the first pad in a third direction, perpendicular to the first direction and the second direction, wherein the semiconductor package further comprises a second bonding wire structure electrically connecting the base substrate and the plurality of semiconductor chips, and the second bonding wire structure includes a fourth bonding wire electrically connecting the second pad of the second semiconductor chip and the second pad of the third semiconductor chip, and a fifth bonding wire electrically connecting the second pad of the first semiconductor chip and the second pad of the second semiconductor chip.

* * * * *